US011581233B2

(12) United States Patent
Jung et al.

(10) Patent No.: US 11,581,233 B2
(45) Date of Patent: Feb. 14, 2023

(54) SEMICONDUCTOR DEVICE AND METHOD OF FORMING ELECTRICAL CIRCUIT PATTERN WITHIN ENCAPSULANT OF SIP MODULE

(71) Applicant: STATS ChipPAC Pte. Ltd., Singapore (SG)

(72) Inventors: JinHee Jung, Incheon (KR); ChangOh Kim, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 17/307,795

(22) Filed: May 4, 2021

(65) Prior Publication Data

US 2022/0359321 A1 Nov. 10, 2022

(51) Int. Cl.
*H01L 23/31* (2006.01)
*H01L 23/60* (2006.01)
*H01L 23/66* (2006.01)
*H01L 21/56* (2006.01)

(52) U.S. Cl.
CPC ............ *H01L 23/31* (2013.01); *H01L 21/565* (2013.01); *H01L 23/60* (2013.01); *H01L 23/66* (2013.01)

(58) Field of Classification Search
CPC .................................................... H01L 21/565
See application file for complete search history.

(56) References Cited

U.S. PATENT DOCUMENTS

| 7,851,894 | B1 | 12/2010 | Scanlan |
| 8,421,210 | B2 | 4/2013 | Chi et al. |
| 9,355,962 | B2 | 5/2016 | Lee et al. |
| 2005/0045369 | A1* | 3/2005 | Ishimaru ............. H01L 23/4334 174/250 |
| 2006/0120056 | A1* | 6/2006 | Sasaki ................... H01L 21/568 257/E23.101 |
| 2009/0242255 | A1* | 10/2009 | Taniguchi ........... H01L 23/3107 29/854 |

* cited by examiner

*Primary Examiner* — Peniel M Gumedzoe
(74) *Attorney, Agent, or Firm* — Robert D. Atkins; Patent Law Group: Atkins and Associates, P.C.

(57) ABSTRACT

A semiconductor device has an electronic component assembly with a substrate and a plurality of electrical components disposed over the substrate. A conductive post is formed over the substrate. A molding compound sheet is disposed over the electrical component assembly. A carrier including a first electrical circuit pattern is disposed over the molding compound sheet. The carrier is pressed against the molding compound sheet to dispose a first encapsulant over and around the electrical component assembly and embed the first electrical circuit pattern in the first encapsulant. A shielding layer can be formed over the electrical components assembly. The carrier is removed to expose the first electrical circuit pattern. A second encapsulant is deposited over the first encapsulant and the first electrical circuit pattern. A second electrical circuit pattern is formed over the second encapsulant. A semiconductor package is disposed over the first electrical circuit pattern.

25 Claims, 11 Drawing Sheets

SEMICONDUCTOR DEVICE AND METHOD OF FORMING ELECTRICAL CIRCUIT PATTERN WITHIN ENCAPSULANT OF SIP MODULE

FIELD OF THE INVENTION

The present invention relates in general to semiconductor devices and, more particularly, to a semiconductor device and method of forming an electrical circuit pattern within an encapsulant disposed over electrical components in a system-in-package (SIP) module.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into a SIP module for higher density in a small space and extended electrical functionality. Within the SIP module, semiconductor die and IPDs are mounted to a substrate for structural support and electrical interconnect.

A common design goal for a semiconductor device is to reduce the footprint and profile, while gaining in functionality. The semiconductor devices need to accommodate a higher density of components in a smaller area. In many known package layouts, a bottom interconnect substrate provides mechanical and electrical connectivity with a circuit pattern or RDL formed on the substrate to support external electrical interconnect to the semiconductor device. To make electrical interconnect on the top of the semiconductor package, another interconnect substrate is typically placed over the top of the package. The top side interconnect substrate adds manufacturing cost and increases the overall height of the SIP module, which is counter to design goals.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
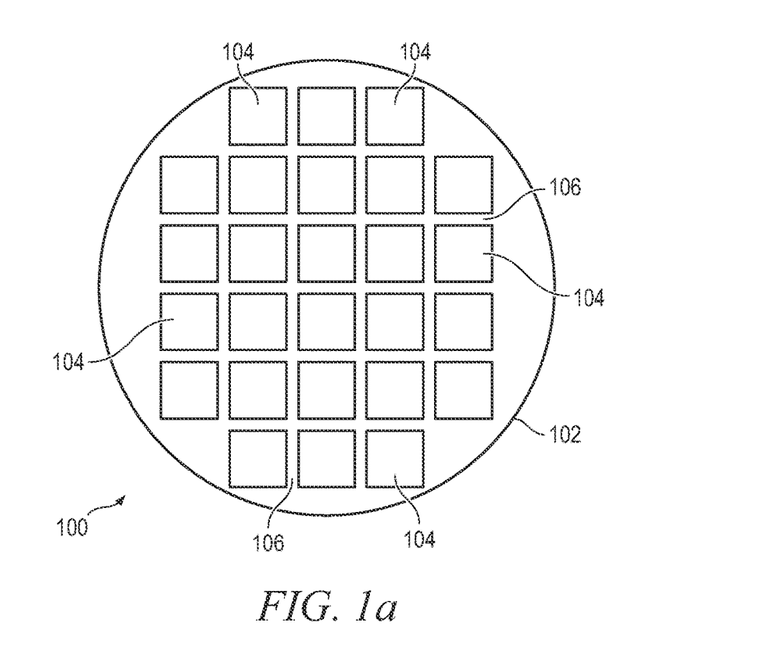
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
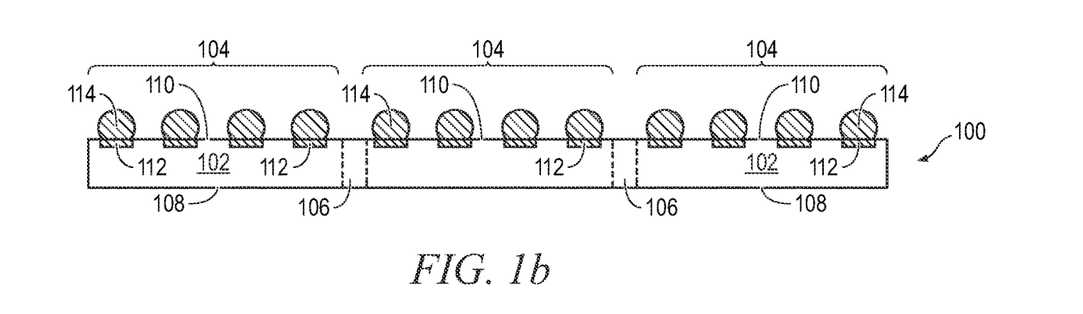

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
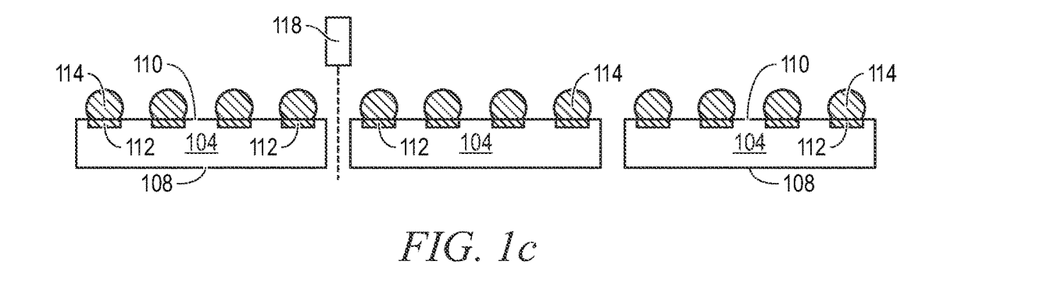

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figures 2A, 2B:
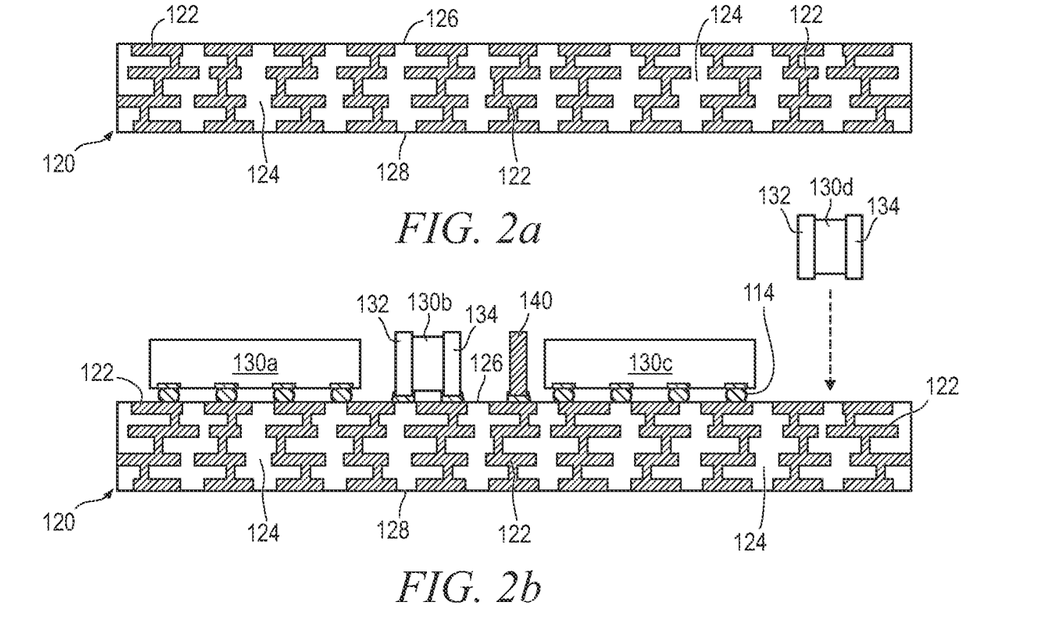
FIGS. 2a-2l illustrate a process of forming an electrical circuit pattern in the encapsulant of an SIP module.

FIGS. 2a-2l illustrate a process of forming an electrical circuit pattern within the encapsulant of an SIP module. FIG. 2a shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122.

Figure 2C:
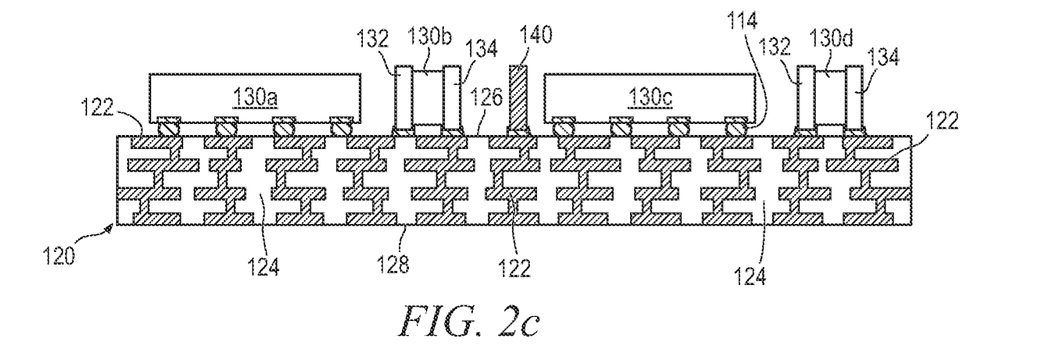

In FIG. 2b, a plurality of electrical components 130a-130d is mounted to surface 126 of interconnect substrate 120 and electrically and mechanically connected to conductive layers 122. Electrical components 130a-130d are each positioned over substrate 120 using a pick and place operation. For example, electrical components 130a and 130c can be semiconductor die 104 from FIG. 1c with active surface 110 and bumps 114 oriented toward surface 126 of substrate 120 and electrically connected to conductive layer 122. Electrical components 130b and 130d are discrete electrical devices or IPDs, such as a transistor, diode, resistor, capacitor, and inductor. Electrical component 130b uses terminals 132 and 134 to make electrical and mechanical connection to conductive layer 122 on interconnect substrate 120. Electrical component 130d uses terminals 136 and 138 to make electrical and mechanical connection to conductive layer 122 on interconnect substrate 120. Alternatively, electrical components 130a-130d can include other semiconductor die, semiconductor packages, surface mount devices, discrete electrical devices, discrete transistors, diodes, or IPDs. Electrical components 130a-130d are mounted to interconnect substrate 120, as shown in FIG. 2c, with bumps 114 and terminals 132-138 making mechanical and electrical connection to conductive layer 122.

Figure 2D:
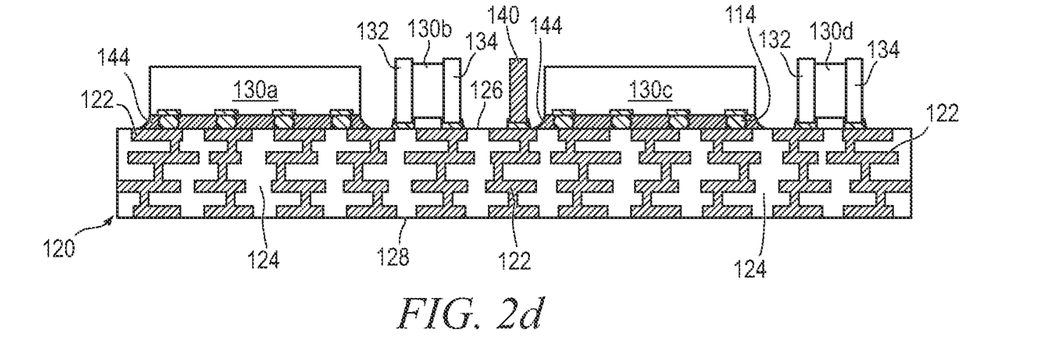

A conductive post or pillar 140 is formed on interconnect substrate 120 and electrically connected to conductive layer 122. Conductive post 140 can be used for vertical electrical interconnect. Alternatively, a plurality of conductive posts 140, or a conductive wall 140, provides electromagnetic shielding between electrical components 130a-103b and electrical components 130c-130d. FIG. 2d shows electrical components 130a-130d and conductive post 140 mounted to interconnect substrate 120 with bumps 114 and terminals 132-138 making mechanical and electrical connection to conductive layer 122.

Figure 2E:
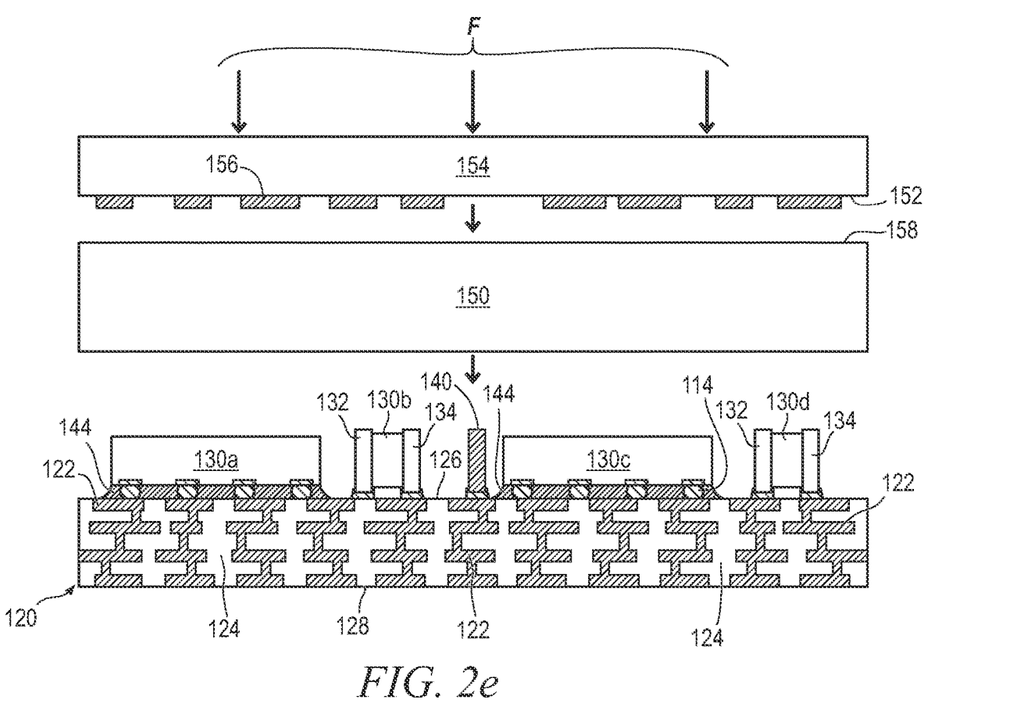
Figure 2F:
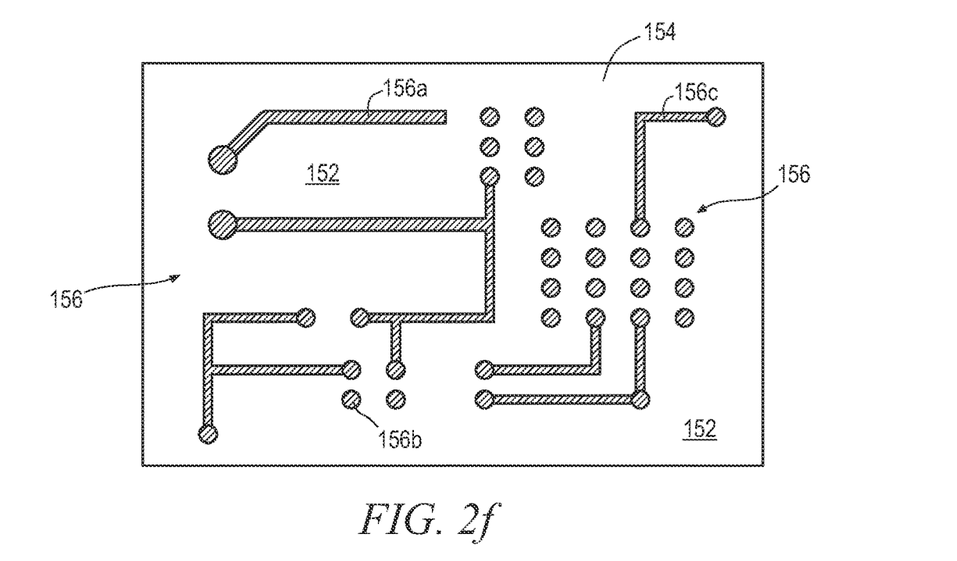
Figure 2G:
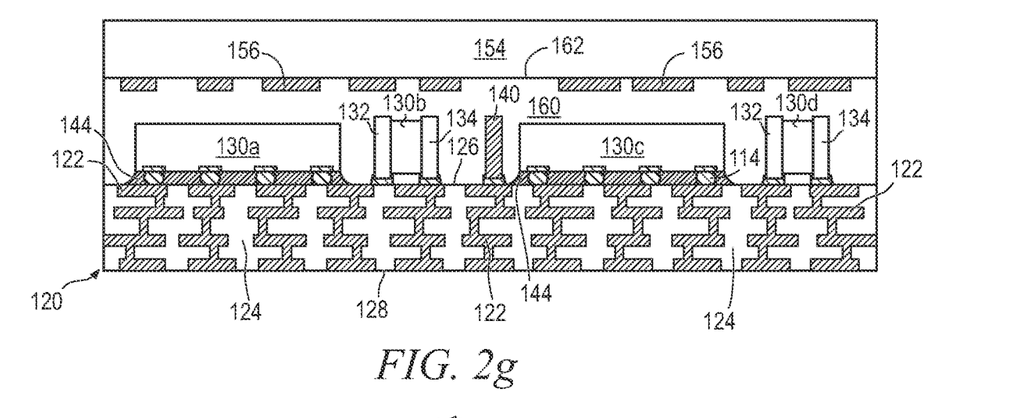

In FIG. 2e, an epoxy molding compound (EMC) sheet 150 is disposed over electrical components 130a-130d and interconnect substrate 120. Surface 152 of carrier 154 includes an electrical circuit pattern 156 designated to interconnect various electric components with the use of traces, redistribution layer (RDL), contact pads, and other interconnect structures. FIG. 2f shows a top view of electrical circuit pattern 156 on surface 152 of carrier 154. For example, electrical circuit pattern 156a provides a trace line, electrical circuit pattern 156b provides a contact pad, and electrical circuit pattern 156c provides an RDL. Carrier 154 is disposed over EMC sheet 150 with surface 152 and electrical circuit pattern 156 oriented toward surface 158 of the EMC sheet. Under force F, carrier 154 presses electrical circuit pattern 156 into surface 158 of EMC sheet 150 and the EMC sheet onto electrical components 130a-130d and conductive post 140. After pressing with force F, EMC sheet 150 covers electrical components 130a-130d, conductive posts 140, and interconnect substrate 120, as shown in FIG. 2g. Electrical circuit pattern 156 is embedded in surface 158 of EMC sheet 150. EMC sheet 150 is now considered encapsulant 160 disposed over electrical components 130a-130d, conductive posts 140, and interconnect substrate 120. Encapsulant 160 can be polymer composite material, such as epoxy resin with filler, epoxy acrylate with filler, or polymer with proper filler. Encapsulant 160 is non-conductive, provides structural support, and environmentally protects the semiconductor device from external elements and contaminants. Electrical circuit pattern 156 is embedded within surface 162 of encapsulant 160.

Figure 2H:
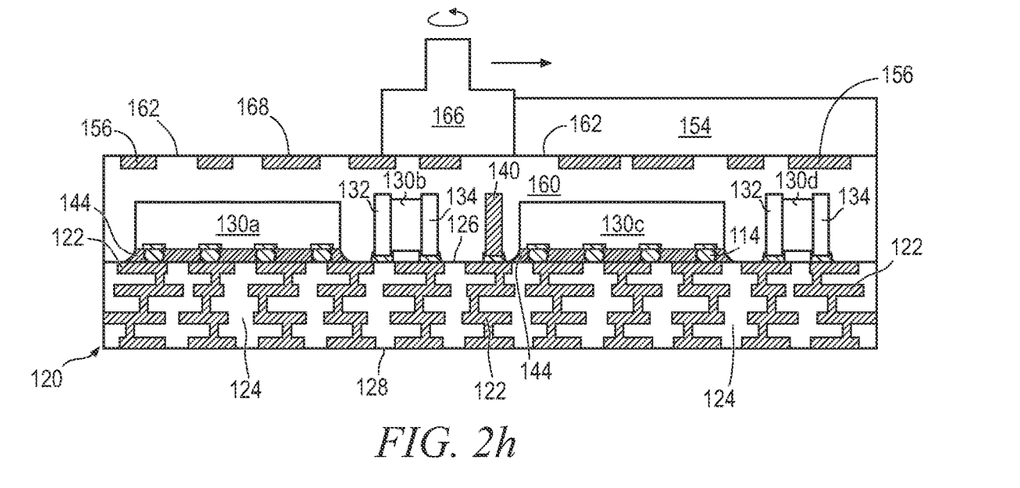
Figure 2I:
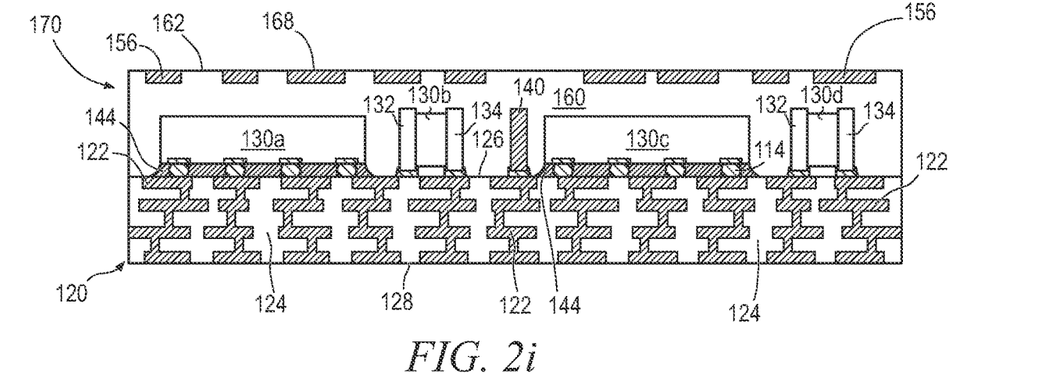

In FIG. 2h, carrier 154 is removed by grinder 166 to expose surface 162 and electrical circuit pattern 156, now at least partially embedded within encapsulant 160. Grinder 166 planarizes surface 162 of encapsulant 160 and surface 168 of electrical circuit pattern 156. Alternatively, carrier 154 is removed by chemical etching, chemical mechanical polishing (CMP), mechanical peel-off, mechanical grinding, thermal bake, ultra-violet (UV) light, laser scanning, or wet stripping to expose surface 162 of encapsulant 160 and surface 168 of electrical circuit pattern 156. FIG. 2i shows SIP module or semiconductor component assembly 170 post-grinding with electrical circuit pattern 156 at least partially embedded with encapsulant 160. Conductive posts 140 can be formed after encapsulant 160 by forming a plurality of vias through the encapsulant and depositing a conductive material in the vias to form the conductive posts.

Figure 2J:
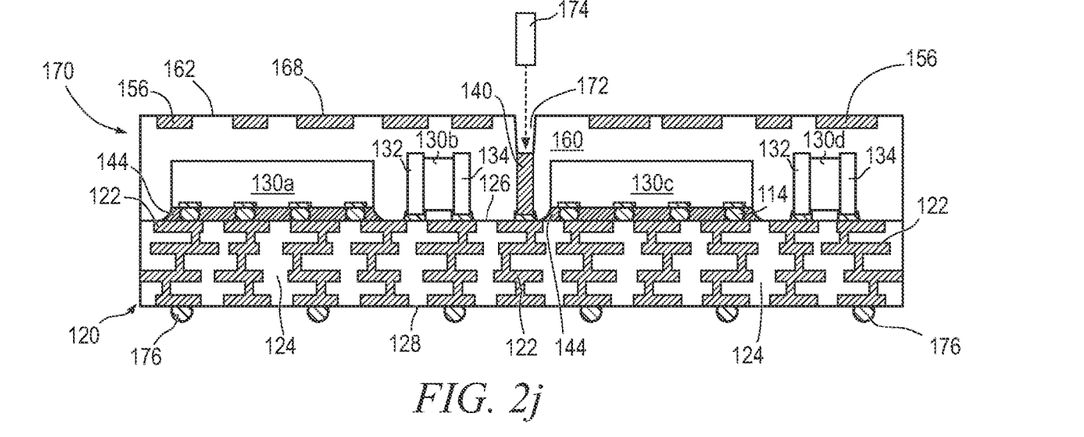

In FIG. 2j, a plurality of vias 172 is formed into surface 162 of encapsulant 160 using etching, drilling, or LDA with laser 174. Vias 172 are aligned with and extend to conductive posts 140. Electric circuit pattern 156 can make electrical connection to interconnect substrate 120 through conductive posts 140.

An electrically conductive bump material is deposited over conductive layer 122 on surface 128 of interconnect substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 176. In one embodiment, bump 176 is formed over a UBM having a wetting layer, barrier layer, and adhesive layer. Bump 176 can also be compression bonded or thermocompression bonded to conductive layer 122. Bump 176 represents one type of interconnect structure that can be formed over conductive layer 122. The interconnect structure can also use bond wires, conductive paste, stud bump, micro bump, or other electrical interconnect.

Figure 2K:
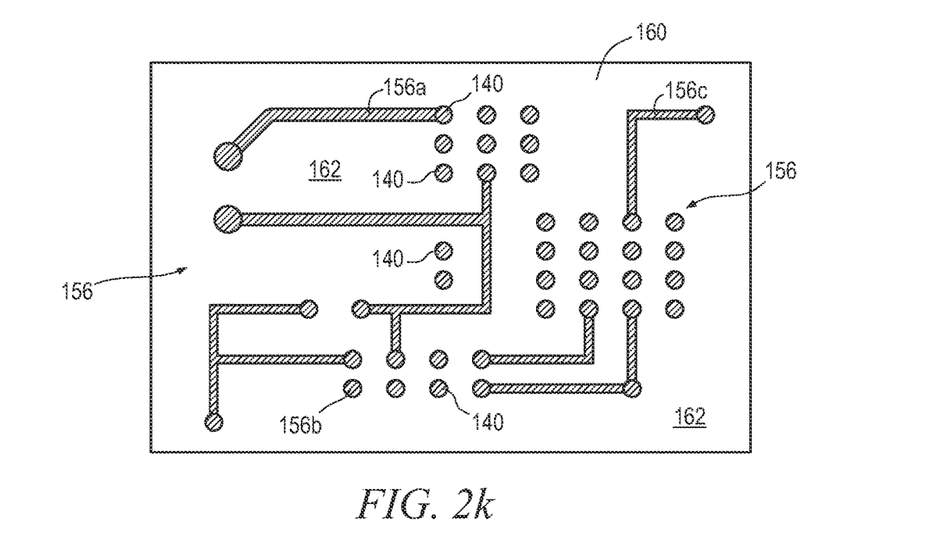
Figure 2L:
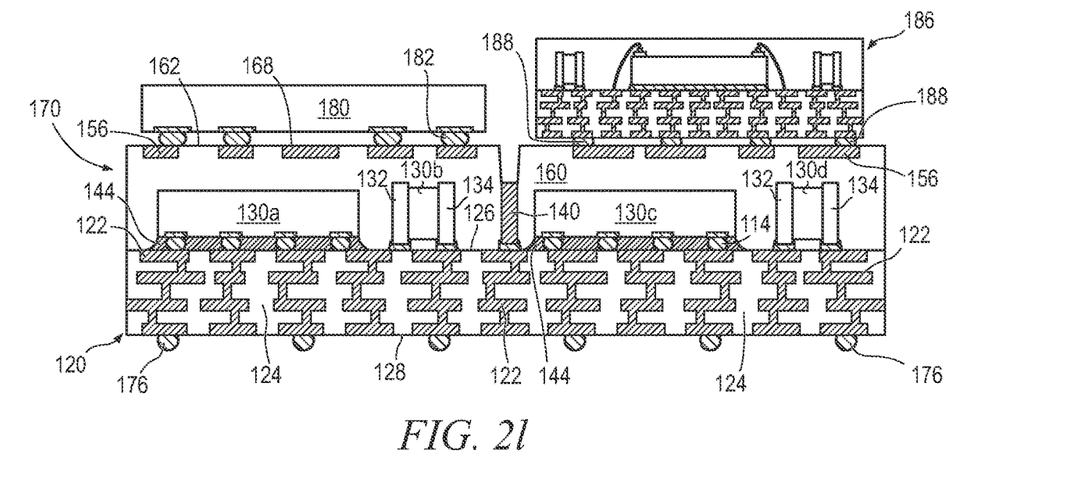

FIG. 2k shows a top view of surface 168 of electrical circuit pattern 156 and conductive posts 140 exposed from encapsulant 160. Electrical circuit pattern 156 provides electrical interconnect, e.g. as an RDL, on surface 162 of encapsulant 160. External terminals can be connected to electric circuit pattern 156 in accordance with the system design. Alternatively, additional semiconductor die or semiconductor packages can be mounted to electrical circuit pattern 156, as shown in FIG. 2l. Semiconductor die 180 makes mechanical and electrical connection to electrical circuit pattern 156 via bumps 182. Semiconductor package 186 with interconnect substrate, semiconductor die, and encapsulant makes mechanical and electrical connection to electrical circuit pattern 156 via bumps 188. Electrical circuit pattern 156 formed in encapsulant 160, as described herein, reduces package thickness and also reduces manufacturing steps and associated costs.

Figure 3A:
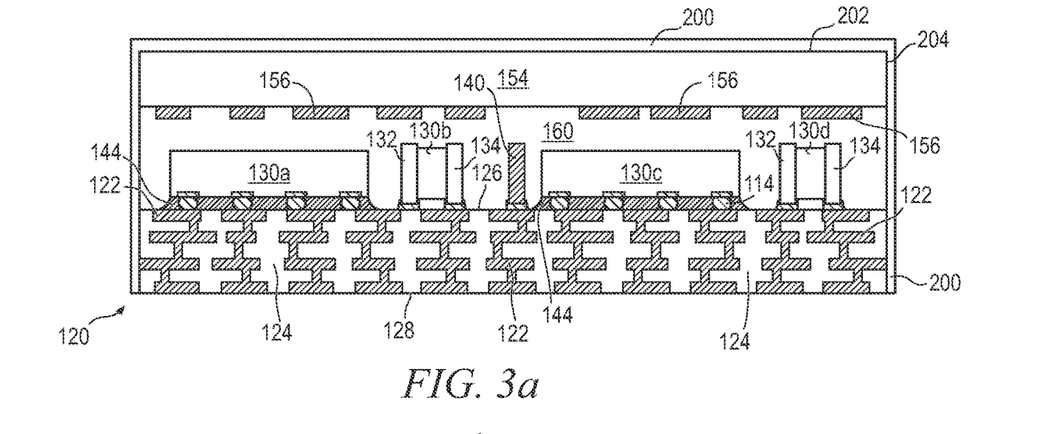
FIGS. 3a-3d illustrate a process of forming an electrical circuit pattern in the encapsulant of an SIP module with electromagnetic shielding.

In an alternate embodiment, continuing from FIG. 2g, electrical components 130a-130d may contain IPDs that are susceptible to or generate EMI, RFI, harmonic distortion, and inter-device interference. For example, the IPDs contained within electrical components 130a-130d provide the electrical characteristics needed for high-frequency applications, such as resonators, high-pass filters, low-pass filters, band-pass filters, symmetric Hi-Q resonant transformers, and tuning capacitors. Alternatively, electrical components 130a-130d contain digital circuits switching at a high frequency, which could interfere with the operation of IPDs with the SIP module. In FIG. 3a, electromagnetic shielding layer 200 is formed over top surface 202 of carrier 154 and side surfaces 204 of the carrier and SIP module to reduce or inhibit EMI, RFI, and other inter-device interference, for example as radiated by high-speed digital devices, from affecting neighboring devices within or adjacent to the SIP module.

Figure 3B:
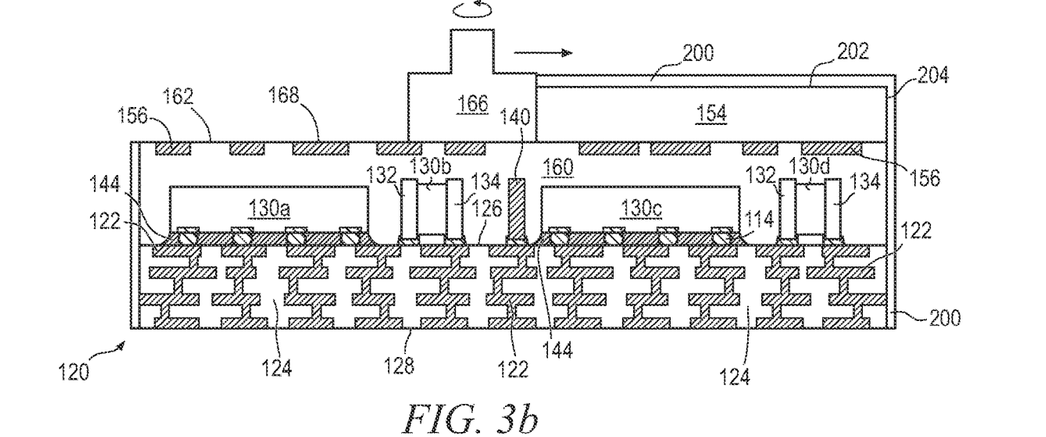
Figure 3C:
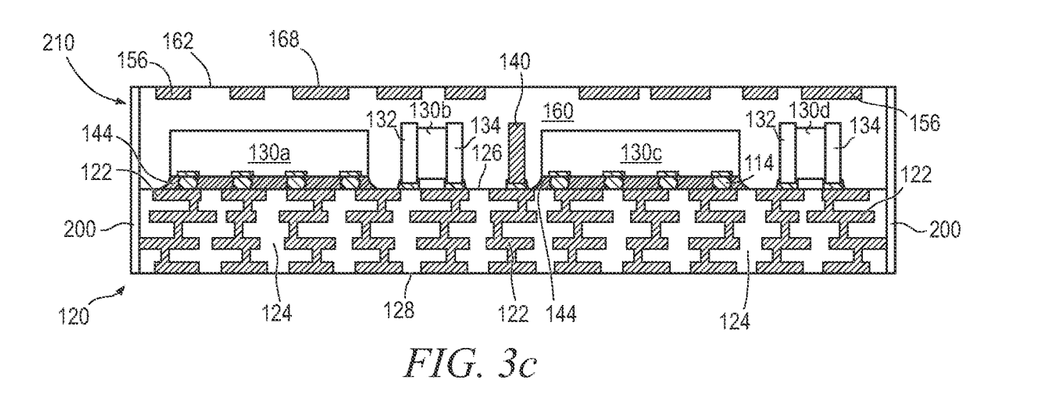

In FIG. 3b, carrier 154 is removed by grinder 166 to expose surface 162 of encapsulant 160 and surface 168 of electrical circuit pattern 156, now at least partially embedded within encapsulant 160. Components having a similar function are assigned the same reference number. Grinder 166 planarizes surface 162 of encapsulant 160 and surface 168 of electrical circuit pattern 156. Alternatively, carrier 154 is removed by chemical etching, CMP, mechanical peel-off, mechanical grinding, thermal bake, UV light, laser scanning, or wet stripping to expose surface 162 of encapsulant 160 and surface 168 of electrical circuit pattern 156. FIG. 3c shows SIP module or semiconductor component assembly 210 post-grinding with electrical circuit pattern 156 at least partially embedded with encapsulant 160.

Figure 3D:
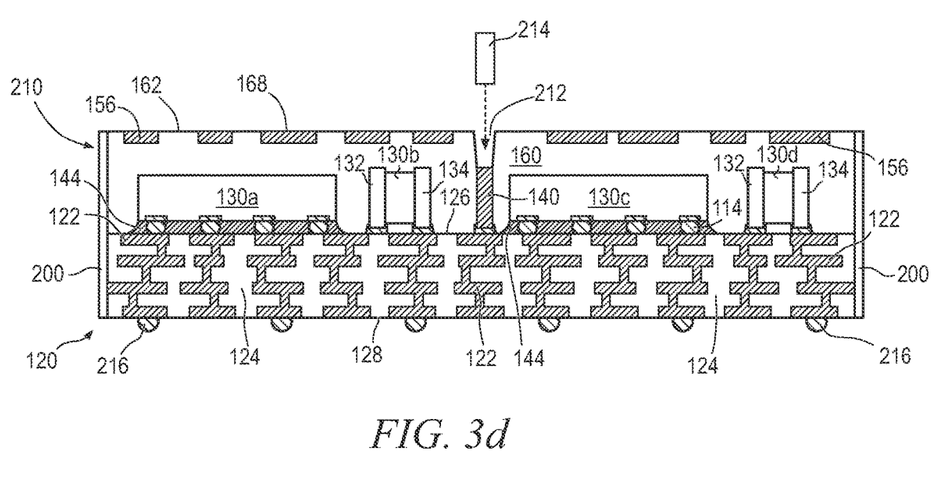

In FIG. 3d, a plurality of vias 212 is formed into surface 162 of encapsulant 160 using etching, drilling, or LDA with laser 214. Vias 212 are aligned with and extend to conductive posts 140. Electric circuit pattern 156 can make electrical connection to interconnect substrate 120 through conductive posts 140.

An electrically conductive bump material is deposited over conductive layer 122 on surface 128 of interconnect substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 216. In one embodiment, bump 216 is formed over a UBM having a wetting layer, barrier layer, and adhesive layer. Bump 216 can also be compression bonded or thermocompression bonded to conductive layer 122. Bump 216 represents one type of interconnect structure that can be formed over conductive layer 122. The interconnect structure can also use bond wires, conductive paste, stud bump, micro bump, or other electrical interconnect.

Electrical circuit pattern 156 provides electrical interconnect, e.g. as an RDL, on surface 162 of encapsulant 160. Electrical circuit pattern 156 formed in encapsulant 160, as described herein, reduces package thickness and also reduces manufacturing steps and associated costs. External terminals can be connected to electric circuit pattern 156 in accordance with the system design. Alternatively, additional semiconductor die or semiconductor packages can be mounted to electrical circuit pattern 156, similar to FIG. 2l.

Figure 4A:
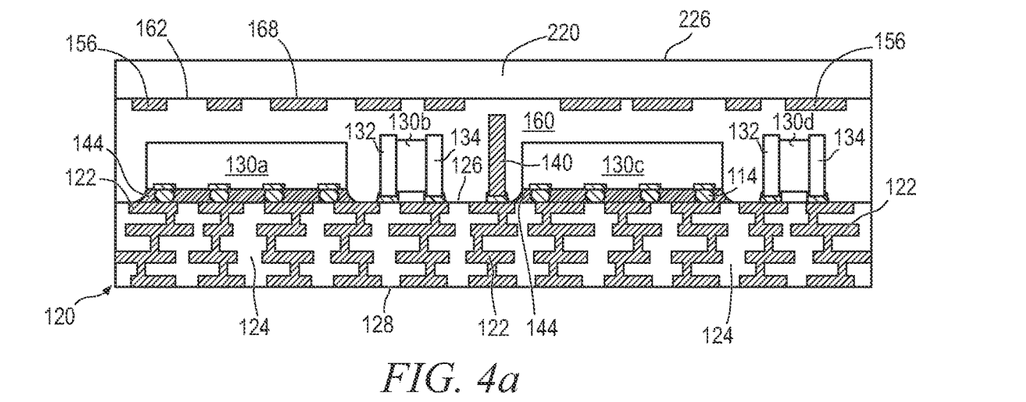
FIGS. 4a-4e illustrate a process of forming multiple layers of electrical circuit patterns in the encapsulant of an SIP module.

In another embodiment, continuing from FIG. 2i, an encapsulant or molding compound 220 is deposited over encapsulant 160 and electrical circuit pattern 156 using a paste printing, compressive molding, transfer molding, liquid encapsulant molding, vacuum lamination, spin coating, or other suitable applicator, as shown in FIG. 4a. Encapsulant 220 can be polymer composite material, such as epoxy resin with filler, epoxy acrylate with filler, or polymer with proper filler. Encapsulant 220 is non-conductive, provides structural support, and environmentally protects the semiconductor device from external elements and contaminants.

Figure 4B:
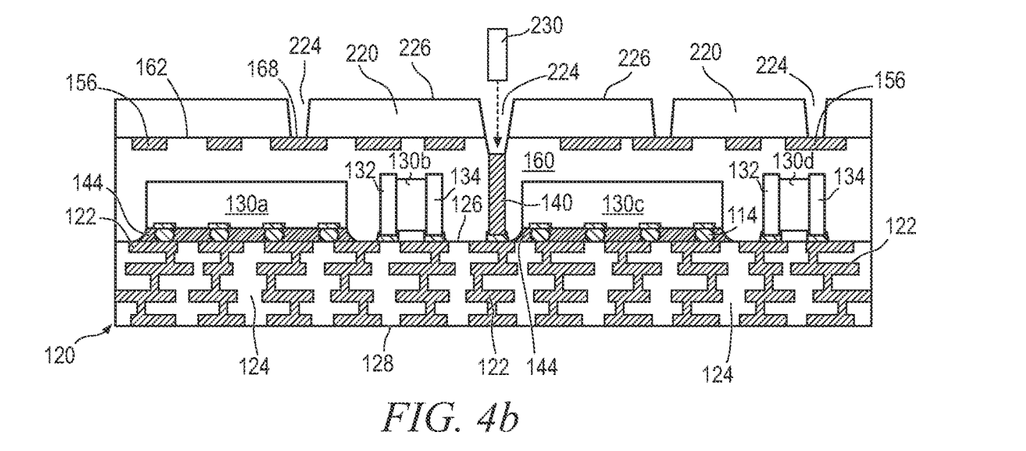

In FIG. 4b, a plurality of vias 224 is formed into surface 226 of encapsulant 220 using etching, drilling, or LDA with laser 230. Vias 224 are aligned with and extend to electrical circuit pattern 156 and conductive posts 140. Electric circuit pattern 156 can make electrical connection to interconnect substrate 120 through conductive posts 140.

Figure 4C:
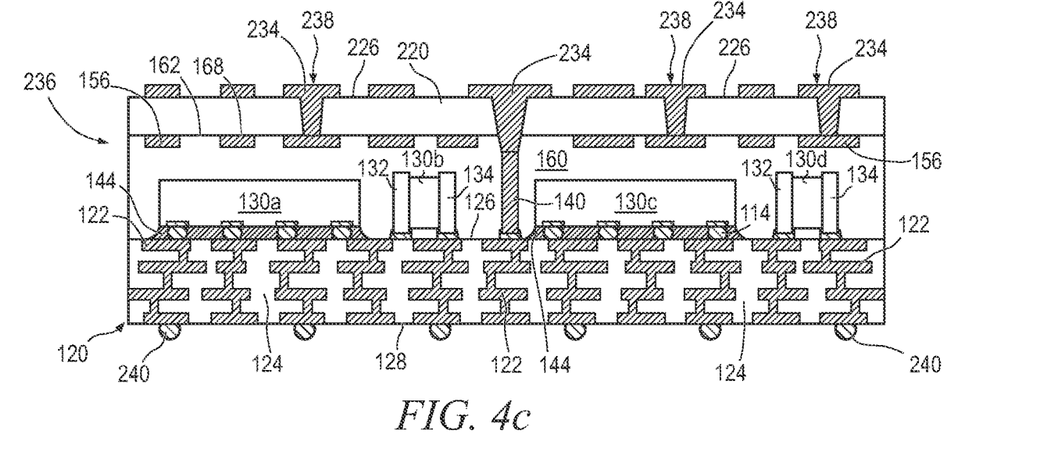

In FIG. 4c, an electrically conductive layer 234 is patterned and formed over surface 226 of encapsulant 220 and into vias 224 using PVD, CVD, electrolytic plating, electroless plating process, or other suitable metal deposition process. Conductive layer 234 can be one or more layers of Al, Cu, Sn, Ni, Au, Ag, or other suitable electrically conductive material. SIP module or semiconductor component assembly 236 shows a first level electrical circuit pattern 156 embedded between encapsulant 160 and encapsulant 220. Conductive layer 234 operates as a second level electric circuit pattern 238 to provide additional electrical interconnect for SIP module 236.

An electrically conductive bump material is deposited over conductive layer 122 on surface 128 of interconnect substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 240. In one embodiment, bump 240 is formed over a UBM having a wetting layer, barrier layer, and adhesive layer. Bump 240 can also be compression bonded or thermocompression bonded to conductive layer 122. Bump 240 represents one type of interconnect structure that can be formed over conductive layer 122. The interconnect structure can also use bond wires, conductive paste, stud bump, micro bump, or other electrical interconnect.

Figure 4D:
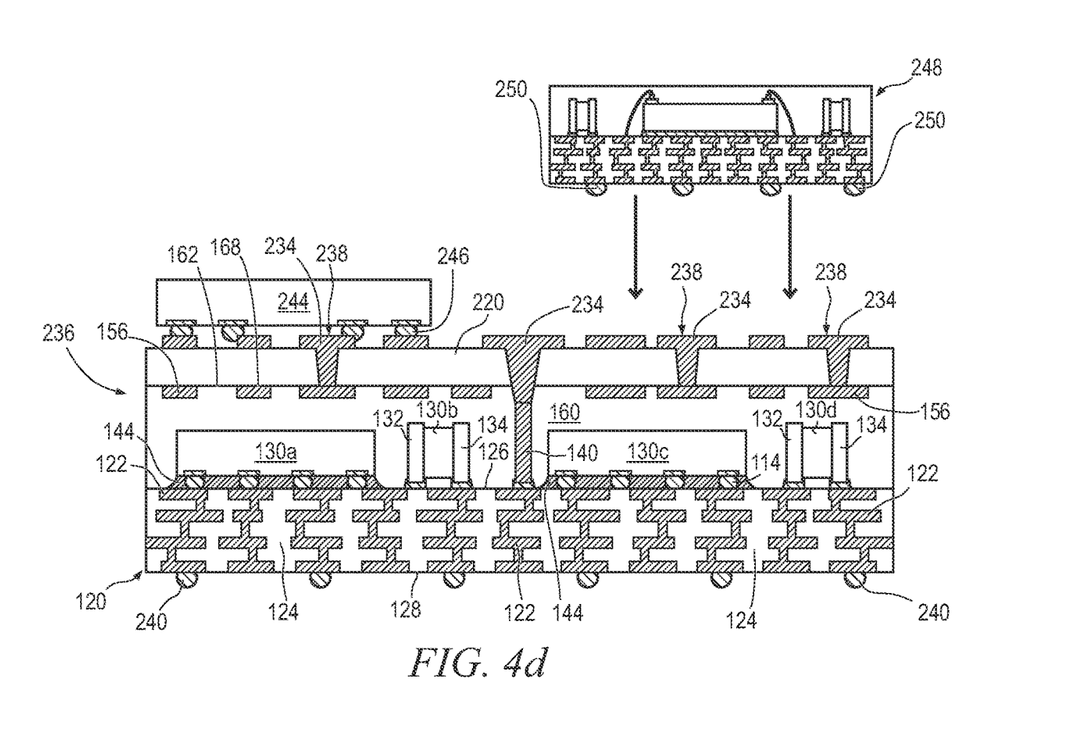
Figure 4E:
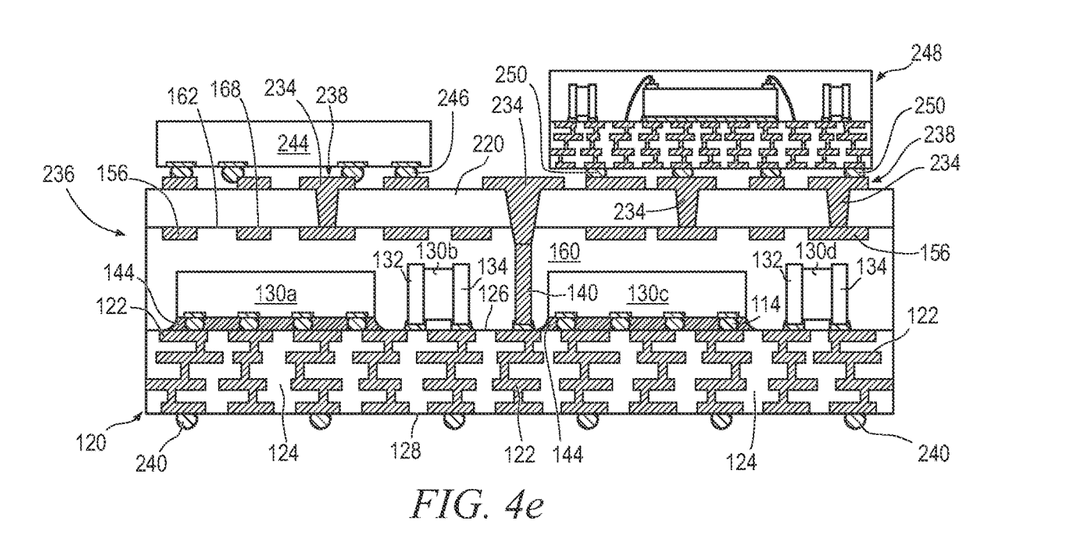

Electrical circuit patterns 156 and 238 provides multiple levels of electrical interconnect, e.g. as multi-level RDLs, on surface 162 of encapsulant 160 and surface 226 of encapsulant 220. External terminals can be connected to electric circuit pattern 156 in accordance with the system design. Alternatively, additional semiconductor die or semiconductor packages can be mounted to electrical circuit pattern 156, as shown in FIG. 4d. Semiconductor die 244 makes mechanical and electrical connection to electrical circuit pattern 238 via bumps 246. Semiconductor package 248 with interconnect substrate, semiconductor die, and encapsulant makes mechanical and electrical connection to electrical circuit pattern 238 via bumps 250. FIG. 4e shows semiconductor die 244 and semiconductor package 248 mounted to SIP module 236 with mechanical and electrical connection to electrical circuit pattern 238. Electrical circuit patterns 156 and 238 formed in encapsulants 160 and 220, as described herein, reduce package thickness and also reduce manufacturing steps and associated costs.

Figure 5:
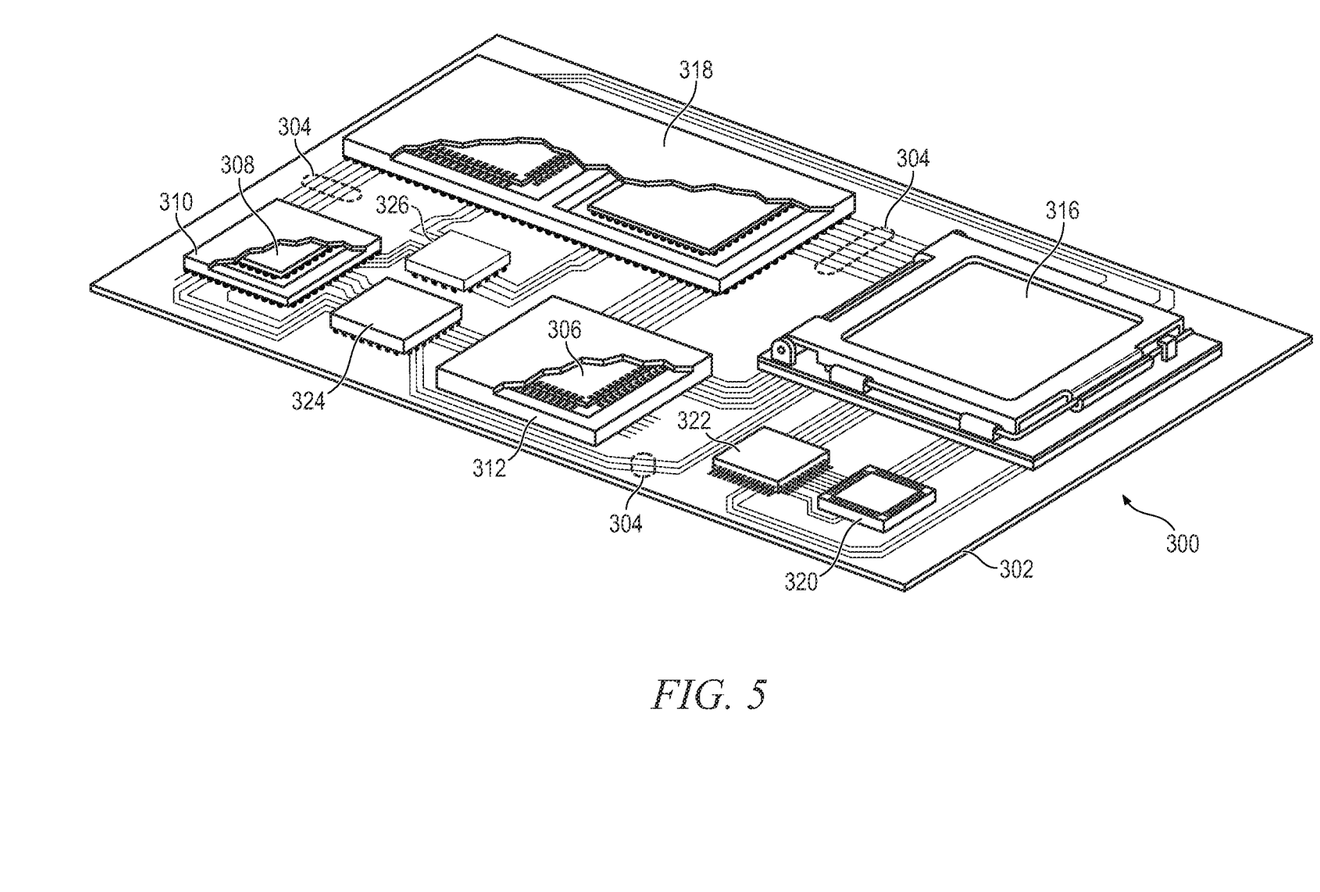
FIG. 5 illustrates a printed circuit board (PCB) with different types of packages mounted to a surface of the PCB.

FIG. 5 illustrates electronic device 300 having a chip carrier substrate or PCB 302 with a plurality of semiconductor packages mounted on a surface of PCB 302, including SIP modules 170, 210, and 236. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 5, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
  providing an electrical component assembly;
  forming a conductive post in contact with the electrical component assembly;
  disposing a molding compound sheet over the electrical component assembly after forming the conductive post in contact with the electrical component assembly;
  disposing a carrier including a first electrical circuit pattern over the molding compound sheet; and
  pressing the carrier against the molding compound sheet to dispose a first encapsulant over and around the electrical component assembly and embed the first electrical circuit pattern in the first encapsulant.

2. The method of claim 1, further including removing the carrier to expose the first electrical circuit pattern.

3. The method of claim 2, further including
disposing a second encapsulant over the first encapsulant and the first electrical circuit pattern; and
forming a second electrical circuit pattern over the second encapsulant.

4. The method of claim 1, further including forming a shielding layer over the electrical component assembly.

5. The method of claim 1, wherein providing the electronic component assembly includes:
providing a substrate; and
disposing a plurality of electrical components over the substrate.

6. The method of claim 1, further including removing a portion of the first encapsulant to expose the conductive post.

7. A method of making a semiconductor device, comprising:
providing a substrate;
forming a conductive post in contact with the substrate;
disposing a molding compound sheet over the substrate after forming the conductive post in contact with the substrate;
disposing a carrier including a first electrical circuit pattern over the molding compound sheet; and
pressing the carrier against the molding compound sheet to dispose a first encapsulant over the substrate and embed the first electrical circuit pattern in the first encapsulant.

8. The method of claim 7, further including disposing a plurality of electrical components over the substrate to form an electrical component assembly.

9. The method of claim 8, further including forming a shielding layer over the electrical component assembly.

10. The method of claim 7, further including removing the carrier to expose the first electrical circuit pattern.

11. The method of claim 10, further including
disposing a second encapsulant over the first encapsulant and the first electrical circuit pattern; and
forming a second electrical circuit pattern over the second encapsulant.

12. The method of claim 7, further including removing a portion of the first encapsulant to expose the conductive post.

13. The method of claim 7, further including disposing a semiconductor package over the first electrical circuit pattern.

14. A method of making a semiconductor device, comprising:
providing an electrical component assembly;
forming a conductive post over the electrical component assembly;
disposing a molding compound sheet over the electrical component assembly after forming the conductive post over the electrical component assembly;
disposing a first electrical circuit pattern over the molding compound sheet; and
pressing the first electrical circuit pattern into the molding compound sheet to dispose a first encapsulant over and around the electrical component assembly and embed the first electrical circuit pattern in the first encapsulant.

15. The method of claim 14, further including
disposing a second encapsulant over the first encapsulant and the first electrical circuit pattern; and
forming a second electrical circuit pattern over the second encapsulant.

16. The method of claim 14, further including forming a shielding layer over the electrical component assembly.

17. The method of claim 14, wherein providing the electronic component assembly includes:
providing a substrate; and
disposing a plurality of electrical components over the substrate.

18. The method of claim 14, further including removing a portion of the first encapsulant to expose the conductive post.

19. The method of claim 14, further including disposing a semiconductor package over the first electrical circuit pattern.

20. A method of making a semiconductor device, comprising:
providing a substrate;
forming a conductive post over the substrate;
disposing a molding compound sheet over the substrate after forming the conductive post over the substrate;
disposing a first electrical circuit pattern over the molding compound sheet; and
pressing the first electrical circuit pattern into the molding compound sheet to dispose a first encapsulant over the substrate and embed the first electrical circuit pattern in the first encapsulant.

21. The method of claim 20, further including disposing a plurality of electrical components over the substrate to form an electrical component assembly.

22. The method of claim 21, further including forming a shielding layer over the electrical component assembly.

23. The method of claim 20, further including:
disposing a second encapsulant over the first encapsulant and the first electrical circuit pattern; and
forming a second electrical circuit pattern over the second encapsulant.

24. The method of claim 20, further including removing a portion of the first encapsulant to expose the conductive post.

25. The method of claim 20, further including disposing a semiconductor package over the first electrical circuit pattern.

* * * * *